(12) United States Patent
Griebenow et al.

(10) Patent No.: US 9,490,189 B2
(45) Date of Patent: Nov. 8, 2016

(54) SEMICONDUCTOR DEVICE COMPRISING A STACKED DIE CONFIGURATION INCLUDING AN INTEGRATED PELTIER ELEMENT

(71) Applicant: GLOBALFOUNDRIES Inc., Grand Cayman (KY)

(72) Inventors: Uwe Griebenow, Markkleeberg (DE); Jan Hoentschel, Dresden (DE); Thilo Scheiper, Dresden (DE); Sven Beyer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/270,941

(22) Filed: May 6, 2014

(65) Prior Publication Data
US 2014/0238045 A1 Aug. 28, 2014

Related U.S. Application Data

(62) Division of application No. 13/097,490, filed on Apr. 29, 2011, now Pat. No. 8,759,960.

(30) Foreign Application Priority Data

May 31, 2010 (DE) .................. 10 2010 029 526

(51) Int. Cl.
*H01L 23/38* (2006.01)
*H01L 35/32* (2006.01)
*G06F 1/20* (2006.01)
*H01L 25/065* (2006.01)
*H01L 25/16* (2006.01)

(52) U.S. Cl.
CPC ................ *H01L 23/38* (2013.01); *G06F 1/20* (2013.01); *H01L 25/0652* (2013.01); *H01L 25/162* (2013.01); *H01L 35/32* (2013.01); *H01L 2924/0002* (2013.01)

(58) Field of Classification Search
CPC ........ H01L 23/38; H01L 27/16; H01L 35/32
See application file for complete search history.

(56) References Cited

U.S. PATENT DOCUMENTS 5,874,775 A 2/1999 Shiomi et al.
5,956,569 A 9/1999 Shiu et al.
(Continued)

FOREIGN PATENT DOCUMENTS

DE 102007051312 B4 9/2009
DE 102008049726 A1 4/2010
WO 2006072063 A1 7/2006

OTHER PUBLICATIONS

Translation of Official Communication from German Patent Office for German Patent Application No. 10 2010 029 526.4-33 dated Feb. 16, 2011.

*Primary Examiner* — David Zarneke
(74) *Attorney, Agent, or Firm* — Amerson Law Firm, PLLC

(57) ABSTRACT

A method of controlling temperature in a semiconductor device that includes a stacked device configuration is disclosed. The method includes providing a Peltier element having a metal-based heat sink formed above a first substrate of the stacked device configuration and a metal-based heat source formed above a second substrate of the stacked device configuration, and establishing a current flow through the Peltier element when the semiconductor device is in a specified operating phase.

20 Claims, 8 Drawing Sheets

(56) References Cited

U.S. PATENT DOCUMENTS

| | | | |
|---|---|---|---|
| 6,121,539 | A | 9/2000 | Johnson et al. |
| 6,222,113 | B1 | 4/2001 | Ghoshal |
| 6,613,602 | B2 | 9/2003 | Cooper et al. |
| 6,614,109 | B2 | 9/2003 | Cordes et al. |
| 6,645,786 | B2 | 11/2003 | Pomerene et al. |
| 6,800,933 | B1 | 10/2004 | Mathews et al. |
| 6,893,902 | B2 | 5/2005 | Cordes et al. |
| 7,224,059 | B2 | 5/2007 | Shimada et al. |
| 7,250,327 | B2 | 7/2007 | Sakamoto |
| 7,352,063 | B2 | 4/2008 | Noguchi |
| 7,560,310 | B2 | 7/2009 | Hsu et al. |
| 7,679,183 | B2 | 3/2010 | Han |
| 7,684,073 | B2 | 3/2010 | Watanabe et al. |
| 7,833,816 | B2 | 11/2010 | Baskaran |
| 7,924,569 | B2 | 4/2011 | Letz |
| 8,030,113 | B2 | 10/2011 | Hsu et al. |
| 8,319,331 | B2 * | 11/2012 | Ibaraki ................ H01L 23/147 257/693 |
| 2005/0085075 | A1 | 4/2005 | Shimada |
| 2006/0001153 | A1 * | 1/2006 | Sakamoto ............ H01L 23/38 257/712 |
| 2006/0012033 | A1 | 1/2006 | Noguchi |
| 2008/0236643 | A1 * | 10/2008 | Li ........................ H01L 35/32 136/203 |
| 2009/0321909 | A1 * | 12/2009 | Gu ....................... H01L 23/38 257/686 |
| 2010/0176506 | A1 * | 7/2010 | Hsu ..................... H01L 23/481 257/698 |
| 2010/0219525 | A1 * | 9/2010 | Ibaraki ............... H01L 23/147 257/693 |
| 2011/0030754 | A1 * | 2/2011 | Smythe ................ H01L 35/08 136/233 |
| 2012/0105145 | A1 * | 5/2012 | Barowski ............ H01L 23/481 327/565 |
| 2012/0139076 | A1 * | 6/2012 | Shankar .............. H01L 23/38 257/467 |
| 2012/0153454 | A1 | 6/2012 | Liu et al. |
| 2015/0059362 | A1 * | 3/2015 | Chou .................... F25B 21/02 62/3.7 |
| 2015/0060039 | A1 * | 3/2015 | Lee ....................... H01L 24/17 165/287 |
| 2015/0115431 | A1 * | 4/2015 | Chadwick ............ H01L 23/38 257/712 |
| 2015/0144171 | A1 * | 5/2015 | Taniguchi ............ H01L 23/38 136/205 |
| 2015/0179543 | A1 * | 6/2015 | Tan ....................... H01L 23/38 62/3.7 |

* cited by examiner

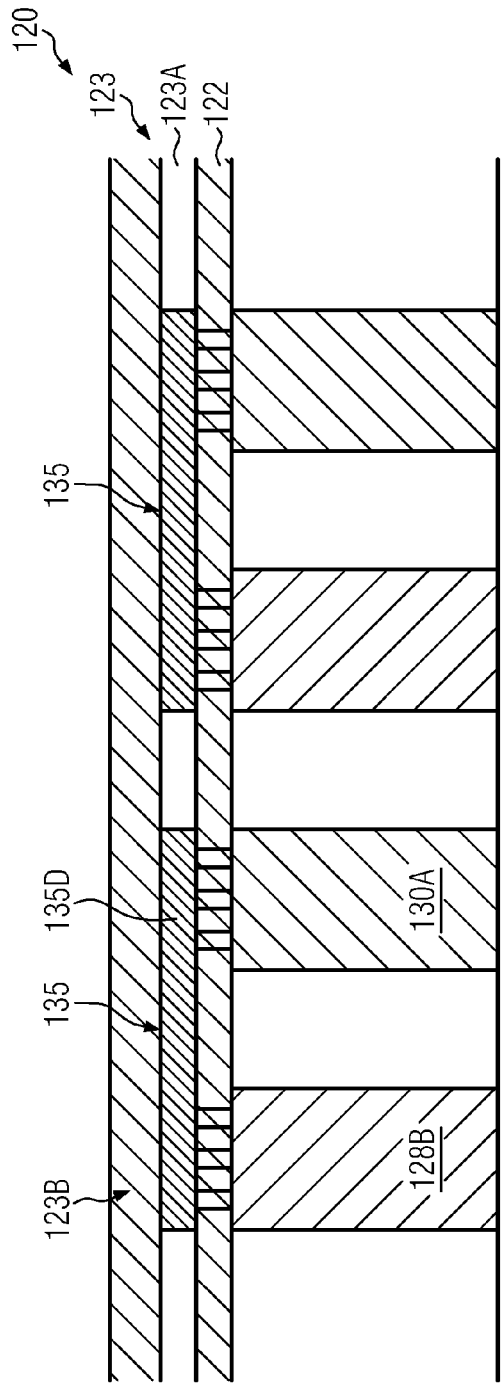
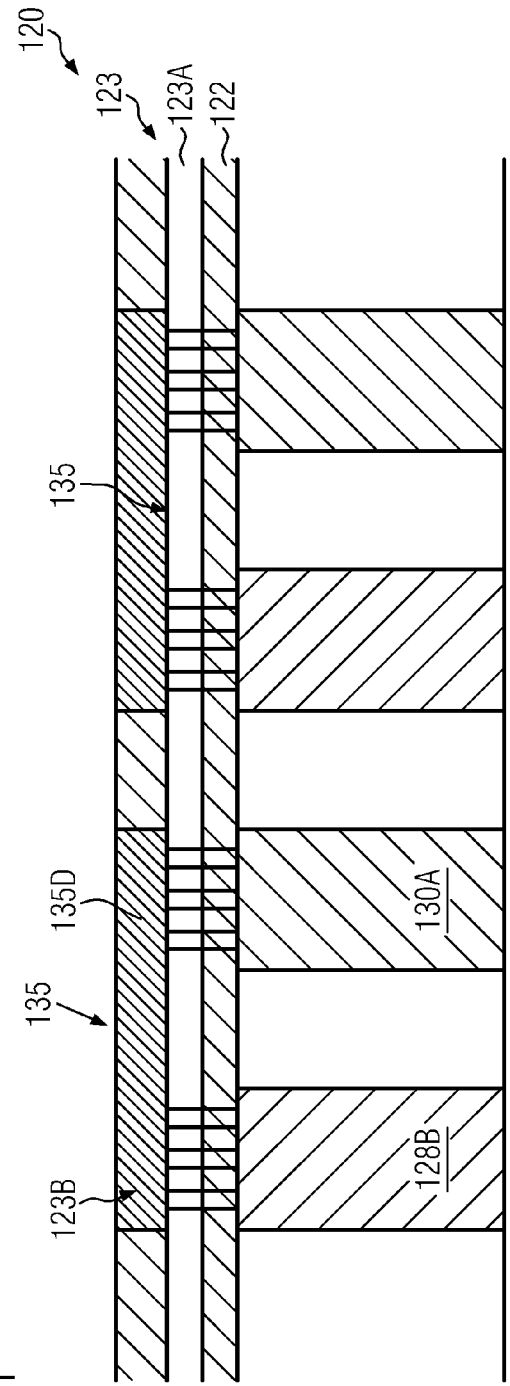

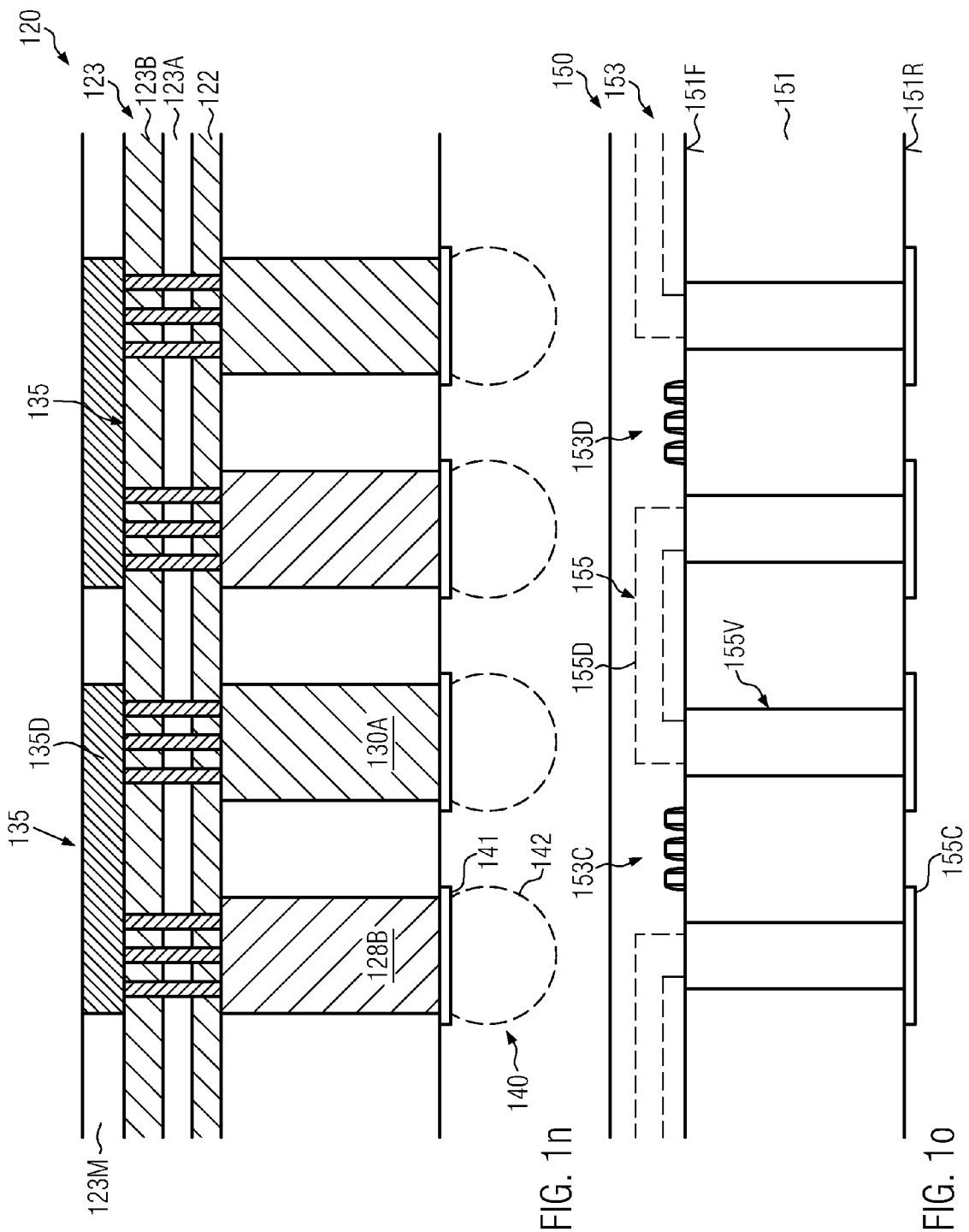

SEMICONDUCTOR DEVICE COMPRISING A STACKED DIE CONFIGURATION INCLUDING AN INTEGRATED PELTIER ELEMENT

CROSS-REFERENCE TO RELATED APPLICATIONS

This is a divisional of co-pending application Ser. No. 13/097,490, filed Apr. 29, 2011, which claimed priority from German Patent Application No. 10 2010 029 526.4, filed May 31, 2010.

BACKGROUND OF THE INVENTION

1. Field of the Invention

The present disclosure generally relates to the field of fabricating integrated circuits, and, more particularly, to temperature management in three-dimensional die configurations.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are reduced with the introduction of every new circuit generation, thereby resulting in currently available integrated circuits formed by volume production techniques with critical dimensions of 50 nm or less and having an improved degree of performance in terms of speed and/or power consumption. Hence, the reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits as required by the basic circuit layout. Due to the reduced dimensions of the active circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

Typically, as the number of circuit elements, such as transistors and the like, per unit area increases in the device level of a corresponding semiconductor device, the number of electrical connections associated with the circuit elements in the device level also increases, typically even in an over-proportional manner, thereby requiring complex interconnect structures which may be provided in the form of metallization systems including a plurality of stacked metallization layers. In these metallization layers, metal lines, providing the inner level electrical connection, and vias, providing intra level connections, may be formed on the basis of highly conductive metals, such as copper and the like, in combination with appropriate dielectric materials so as to reduce the parasitic RC (resistive capacitive) time constants, since, in sophisticated semiconductor devices, typically, signal propagation delay may be substantially restricted by the metallization system rather than the transistor elements in the device level. However, expanding the metallization system in the height dimension to provide the desired density of interconnect structures may be restricted by the parasitic RC time constants and the constraints imposed by the material characteristics of sophisticated low-k dielectrics. That is, typically, a reduced dielectric constant is associated with reduced mechanical stability of these dielectric materials, thereby also restricting the number of metallization layers that may be stacked on top of each other in view of yield losses during the various fabrication steps and the reduced reliability during operation of the semiconductor device. Thus, the complexity of semiconductor devices provided in a single semiconductor chip may be restricted by the capabilities of the corresponding metallization system, and in particular by the characteristics of sophisticated low-k dielectric materials, since the number of metallization layers may not be arbitrarily increased.

For this reason, it has also been proposed to further enhance the overall density of circuit elements for a given size or area of a respective chip package by stacking two or more individual semiconductor chips, which may be fabricated in an independent manner, however, with a correlated design so as to provide, in total, a complex system, while avoiding many of the problems encountered during the fabrication process for extremely complex semiconductor devices on a single chip. For example, appropriately selected functional units, such as memory areas and the like, may be formed on a single chip in accordance with well-established manufacturing techniques, including the fabrication of a corresponding metallization system, while other functional units, such as a fast and powerful logic circuitry, such as a central processing unit (CPU), may be formed independently as a separate chip, wherein, however, respective interconnect systems may enable a subsequent stacking and attaching of the individual chips so as to form an overall functional circuit, which may then be packaged as a single unit. In other cases, power circuitry operated at moderately high voltages and having a high power consumption may be combined with sensitive control circuits, wherein both functional units may be provided in separate chips. Thus, a corresponding three-dimensional configuration may provide increased volume density of circuit elements and metallization features with respect to a given area of a package, since a significantly larger amount of the available volume in a package may be used by stacking individual semiconductor chips. Although this technique represents a promising approach for enhancing the volume packing density and functionality for a given package size for a given technology standard, while avoiding extremely critical manufacturing techniques, for instance in view of stacking a large number of highly critical metallization layers, the heat management of these three-dimensional chip arrangements may be difficult, in particular when high power consuming chips are included.

For example, in sophisticated CPU devices, the static and dynamic power consumption may result in significant waste heat that has to be dissipated from the device, which is typically accomplished by providing an efficient heat dissipation path from the semiconducting material to a periphery via a package substrate, which in turn may be contacted with an appropriate heat sink, such as a cooler fan and the like. In this case, the rear side of the semiconductor substrate may be efficiently cooled on the basis of the external heat sink via the substrate material and the package substrate. In a stacked device configuration, in which, for instance, a sophisticated memory device, such as a dynamic RAM device, may be incorporated, the efficient thermal coupling of the rear side of the CPU with the external efficient heat sink may no longer be available, since the substrate of the memory circuit may be attached to the high power semiconductor device, thereby significantly reducing the overall heat dissipation capability. In this case, the stacked device configuration may provide superior overall volume packing density, while, however, actual performance may be reduced, at least in an operating phase, in which significant power consumption is required in the CPU. Consequently, in some conventional approaches, dedicated material or material systems are implemented into the stacked device configuration, for instance between the rear sides of the semiconductor substrates, in order to efficiently enhance heat dissipation from the high power device, for instance the CPU, into the device having a significantly reduced power consumption in order to finally connect to an external heat sink. In other cases, additional measures may be taken to enhance the heat dissipation capability via a metallization system of the high power device, wherein, in particular in sophisticated applications, corresponding low-k dielectric materials provided in complex metallization systems may significantly reduce the overall power dissipation capabilities, thereby rendering this approach a less attractive option for stacked device configurations, in which sophisticated high power devices, such as complex CPUs, are to be used.

Generally, the concept of transferring an increased amount of heat from the high power device into the low power device may allow a certain reduction of the overall temperature gradient in the stacked device configuration, wherein, however, the limited heat dissipation capabilities of corresponding material systems provided between the substrates of the high power device and low power device, in combination with the restricted heat dissipation capability of the metallization system of the low power device, may result in a limited overall heat dissipation capability, thereby also restricting performance of the stacked device configuration.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices having a stacked device configuration, i.e., a configuration in which complex integrated circuits may be formed in and above individual substrates, such as semiconductor materials, and be connected in a stacked configuration, wherein superior overall temperature management may be accomplished by providing an active heat transfer system. As discussed above, frequently, a high power integrated circuit, such as a CPU or any other complex circuit including an arithmetic circuit unit, may be combined with an integrated circuit by attaching the substrates of these semiconductor devices in any appropriate manner, wherein, however, in particular the heat dissipation capability of the high power circuit may be significantly restricted, since, for example, the rear side thereof may no longer be cooled. In order to provide superior heat dissipation capabilities, an active heat transfer system, in the form of a Peltier element, may be implemented with an appropriate configuration so as to provide an overall superior thermally conductive path within the stacked device configuration. In some respective aspects disclosed herein, the Peltier element may be appropriately "distributed" across two stacked semiconductor devices, wherein the effective heat sink of the distributed Peltier element may be positioned at a critical area of the stacked device configuration, for instance close to or above the semiconductor layer, in which sophisticated circuit elements are provided, which may typically produce a significant amount of waste heat. On the other hand the second thermal contact area of the distributed Peltier element may be provided in the second semiconductor device, for instance within the metallization system, and may be efficiently connected to corresponding semiconductor regions of the distributed Peltier element in order to obtain an overall very efficient heat dissipation path. Consequently, in this manner, the waste heat, which may be substantially produced in one of the stacked semiconductor devices, may be efficiently transferred to the second stacked semiconductor device on the basis of an active heat transfer mechanism, wherein the corresponding effective temperature reservoirs of the distributed Peltier element may be appropriately positioned within the stacked semiconductor devices, so as to enable a very efficient transfer of the waste heat to an external heat sink of a stacked device configuration. Consequently, a high power device in a stacked configuration may be thermally coupled to an external heat sink in a similar efficient manner or even in a superior manner as in a single device configuration, while at the same time providing the possibility of superior overall volume packing density.

One illustrative method disclosed herein relates to controlling temperature in a semiconductor device that comprises a stacked device configuration. The method comprises providing a Peltier element comprising a metal-based heat sink that is formed above the first substrate of the stacked device configuration. The Peltier element further comprises a metal-based heat source formed above a second substrate of the stacked device configuration. Moreover, the method comprises establishing a current flow through the Peltier element when the semiconductor device is in a specified operating phase.

In another exemplary embodiment, a method is disclosed for controlling temperature in a semiconductor device that includes a plurality of stacked substrates. The method includes providing a Peltier element having a metal-based heat sink formed above a first one of the plurality of stacked substrates and a metal-based heat source formed above a second one of the plurality of stacked substrates, wherein the first one of the plurality of stacked substrates includes a central processing unit and the second one of the plurality of stacked substrates includes a memory circuit. The disclosed method further includes, among other things, operatively coupling a control unit to the Peltier element and controlling a current flow through the Peltier element with the control unit.

BRIEF DESCRIPTION OF THE DRAWINGS

The disclosure may be understood by reference to the following description taken in conjunction with the accompanying drawings, in which like reference numerals identify like elements, and in which:

FIGS. 1*k*-1*n* schematically illustrate cross-sectional views of a semiconductor device according to illustrative embodiments in which various configurations of the wiring system in combination with circuit elements are illustrated;

FIG. 1*o* schematically illustrates a cross-sectional view of a second semiconductor device, i.e., a second part of a stacked device configuration, comprising a second wiring system for connecting to the Peltier element, according to illustrative embodiments;

Figure 1A:
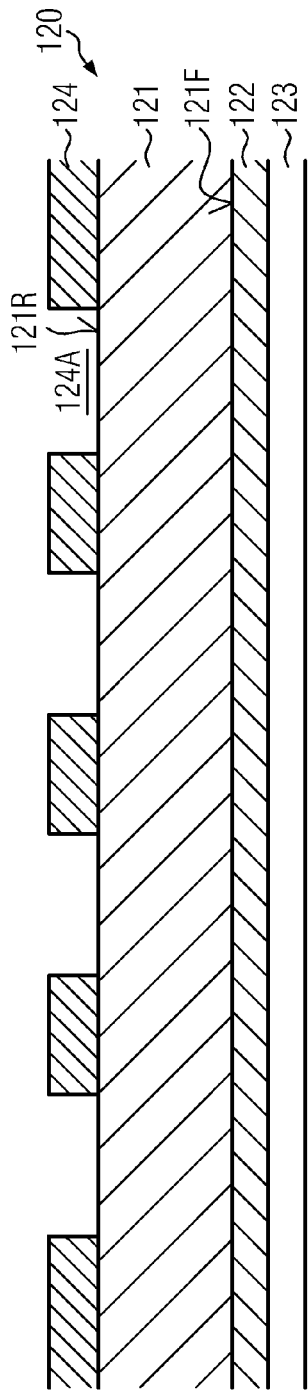
FIGS. 1a-1i schematically illustrate cross-sectional views of a semiconductor device during the various stages in forming a portion of a Peltier element and a semiconductor device, which represents the first semiconductor device of a stacked device configuration, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices comprising a stacked device configuration and a method of operating the same, wherein a superior heat management may be achieved by providing an active heat transfer system in the stacked device configuration in such a manner that waste heat may be efficiently transferred from critical device areas, such as a high power semiconductor device, to an external heat sink via at least one further semiconductor device of the stacked configuration. For example, as previously discussed, frequently, complex integrated circuits including fast-switching circuitry with high power consumption may be combined with additional circuitry, such as less power consuming memory circuits, in order to increase overall volume packing density, thereby providing superior functionality within a given package size or volume, which may provide superior applicability, for instance in mobile applications and the like. Since the stacked device configuration may require a coupling of the individual semiconductor devices via their rear sides of the devices, efficient thermal coupling of a high power semiconductor device, such as a CPU, to an external heat sink, such as a cooler fan and the like, is no longer available. According to the principles disclosed herein, an active heat transfer system, i.e., a Peltier element, may be provided with an appropriate configuration so as to appropriately position the "heat sink" area of the Peltier element in the high power semiconductor device, while the "heat source" area of the Peltier element may be positioned in the second semiconductor device at an appropriate position, thereby providing an efficient overall thermally conductive path within the stacked device configuration.

For instance, the substrate of one of the semiconductor devices may be efficiently used for providing therein semiconductor elements of the Peltier element, which may be appropriately connected by a metal-based wiring system, which may thus act as a heat sink or heat source of the Peltier element, while the complementary heat source or heat sink of the Peltier element may be provided in or above the second semiconductor device of the stacked configuration. In this sense, the Peltier element may be referred to as a "distributed" Peltier element, since at least the two metal-based wiring systems may be provided in or above different substrates of the stacked semiconductor devices.

The semiconductor regions of the Peltier element are typically semiconductor regions having a different conduction band energy level that are, for instance, provided in the form of inversely doped areas of the same basic semiconducting material, such as silicon/germanium material, or any other appropriate semiconductor compound materials, such as bismuth telluride and the like, may be efficiently formed on the basis of well-established process technologies, wherein the moderately large size of these semiconductor regions does not require any sophisticated lithography and patterning strategies. That is, compared to the critical dimensions of actual circuit elements, such as gate electrode structures and the like, which may be 50 nm and significantly less, the lateral dimensions, as well as the thickness, of any such semiconductor regions of the Peltier element may be in the range of several micrometers to several tens or hundreds of micrometers. Consequently, these semiconductor regions may be readily formed at any appropriate manufacturing stage, for instance, prior to providing actual circuit elements, such as transistors, or after completing the transistor structures, while the corresponding wiring system may be formed on the basis of process techniques that are used for forming the wiring system of the semiconductor devices, such as contact levels, metallization systems and the like. Hence, only a few additional process steps may be required, which may be performed on the basis of less critical process strategies, such as non-critical lithography processes, patterning processes, deposition processes and the like.

Furthermore, in some illustrative embodiments disclosed herein, the distributed Peltier element may be appropriately operated, for instance, on the basis of a control unit, which may be provided, at least partially, within the stacked device configuration or which may be provided externally to the stacked semiconductor device, in order to obtain superior performance in terms of overall power consumption, temperature control and the like. For example, the Peltier element or one or more Peltier elements, if a plurality of Peltier elements may be provided in the stacked configuration, may be operated on demand, i.e., depending on the actual temperature and temperature distribution in the stacked configuration, thereby avoiding undue power consumption during operating phases, in which significant heat transfer capabilities are not required. To this end, appropriate temperature sensors may be used or one or more of the Peltier elements itself may be used as a temperature monitor, which may provide an appropriate temperature signal indicating the temperature status in the stacked configuration. Thus, an appropriate operating mode of the Peltier element may be selected on the basis of the temperature signal, for instance, a current flow may be established, for instance by simply activating or de-activating the Peltier element, while, in other cases, the current flow may be adjusted in its magnitude so as to appropriately adapt the heat transfer capability in view of the temperature situation within the stacked device configuration.

FIG. 1a schematically illustrates a cross-sectional view of a semiconductor device 120, which may represent a first device of a stacked device configuration to be formed on the basis of the semiconductor device 120 and at least a further semiconductor device, as will be described later on in more details. The device 120 may comprise a substrate 121, such as a semiconductor material, for instance in the form of silicon and the like, wherein the substrate 121 has a backside or rear side 121R and a front side 121F, wherein the front side 121F is to be understood as a surface of the substrate above which semiconductor-based circuit elements, such as transistors and the like, are to be formed. It should be appreciated that, in FIG. 1a, the substrate 121 is illustrated in a "flipped" configuration, wherein a back side or rear side processing will be applied so as to form appropriate semiconductor regions of a Peltier element in the substrate 121 subsequently without affecting the front side 121F for any device levels formed thereabove. It should be appreciated that the overall dimensions of the substrate 121 are of illustrative nature only and are not true to scale. For example, typically, the thickness of the substrate 121 may be in the range of several hindered micrometers, while lateral dimensions may be in the range of several millimeters to several tens of millimeters, if a single die area is considered, while, in the manufacturing stage shown, the plurality of devices 120 may be provided as a single wafer, which may have lateral dimensions of several hundred millimeters. In the embodiment shown, a buried insulating material 122 may be provided "above" the front side 121F and may be represented by a silicon dioxide material and the like. Moreover, a device level 123 may be formed above the front side 121F and may represent, in the manufacturing stage shown, at least a semiconducting material, such as a silicon material, possibly in combination with a dielectric material of a contact level. It should be appreciated that the semiconductor material in the device level 123, in combination with the buried insulating material 122, may form an SOI (semiconductor- or silicon-on-insulator) configuration, while, in other cases, the material 122 may be omitted and the crystalline semiconducting material of the device level 123 may represent a crystalline portion of the substrate 121, thereby forming a bulk configuration. Moreover, circuit elements may be formed in the device level 123, for instance in the form of transistors, such as field effect transistors, with are preferably used in sophisticated logic circuitry, such as CPUs and the like. In other cases, any such circuit elements may be formed in a later manufacturing stage.

Moreover, as illustrated, a mask layer 124 may be provided above the rear side 121R and may comprise appropriate mask openings 124A, which define the lateral size and position of semiconductor regions for one or more Peltier elements to be provided in the substrate 121. The mask material 124 may be provided in the form of a resist material, a hard mask material in combination with the resist material and the like.

The semiconductor device 120 as illustrated in FIG. 1a may be formed on the basis of the following process strategy. In some illustrative embodiments, the device level 123, for instance comprising the semiconductor material in this manufacturing stage, may be processed so as to form circuit elements, such as isolation structures, transistors, resistors and the like, which may include sophisticated lithography techniques, etch techniques, deposition processes, planarization processes, anneal processes and the like. For example, transistors may be formed on the basis of critical dimensions of 50 nm and less, depending on the device requirement. In some embodiments, any high temperature anneal processes may be performed prior to subjecting the device 120 to a rear side processing. In other cases, the corresponding semiconductor regions used for a Peltier element still to be formed may not allow performing subsequent high temperature processes, so that corresponding circuit elements or portions thereof, which may not require any anneal processes, may be formed in a later manufacturing stage. The mask 124 may be formed on the basis of any well-established process strategy, since, as previously discussed, the relatively large dimensions of the mask openings 124A may result in non-critical lithography and patterning conditions.

Figure 1B:
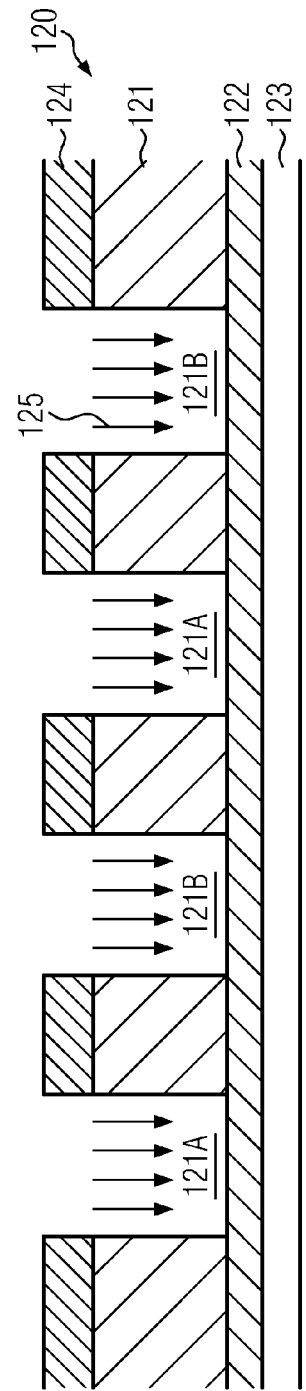

FIG. 1b schematically illustrates the device 120 during an etch process 125, such as a plasma assisted etch process, wherein well-established recipes typically used in deep trench etch processes may be applied so as to form corresponding openings 121A, 121B in the substrate 121. The openings 121A, which may be provided in the form of trenches and the like, may have any appropriate depth and may, as illustrated, extend to the buried insulating material 122, which may be used as an efficient stop material. In other cases, the openings 121A, 121B may extend to any other appropriate depth within the layer 121, for instance, when the buried insulating material 122 is not provided. In this case, a time controlled etch process may be applied, wherein, due to the less critical process conditions, a high degree of uniformity in depth and lateral dimensions of the opening 121A, 121B may be accomplished. It should further be appreciated that any process-related non-uniformities during the patterning process 125 may not significantly affect performance of the finally obtained Peltier element. After the etch process 125, the mask layer 124 may be removed, for instance, by well-established resist removal processes and the like, possibly followed by additional cleaning processes, if required. It should be appreciated that, if required, any appropriate mask layer (not shown) may also be provided above the device level 123 in order to preserve integrity of any circuit elements formed therein or to provide superior integrity if a contact with a reactive process atmosphere, such as the etch process 125 and any additional cleaning processes, is considered inappropriate.

Figure 1C:
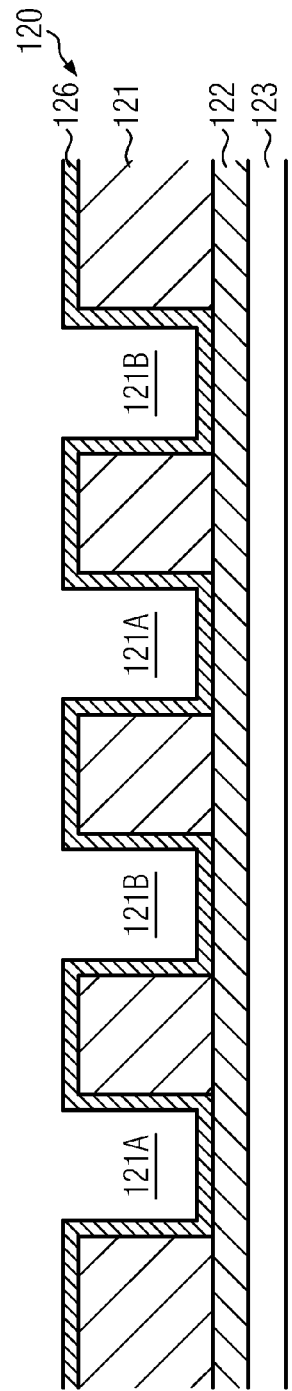

FIG. 1c schematically illustrates the device 120 after the deposition of an insulating material 126 above the substrate 121 and within the openings 121A, 121B. The insulating material 126 may be provided in the form of any appropriate material, such as silicon dioxide, silicon nitride and the like, thereby efficiently isolating any semiconducting materials to be formed in the openings 121A, 121B from the substrate 121. The dielectric material 126 may be deposited on the basis of any appropriate deposition technique, such as chemical vapor deposition (CVD) and the like.

Figure 1D:
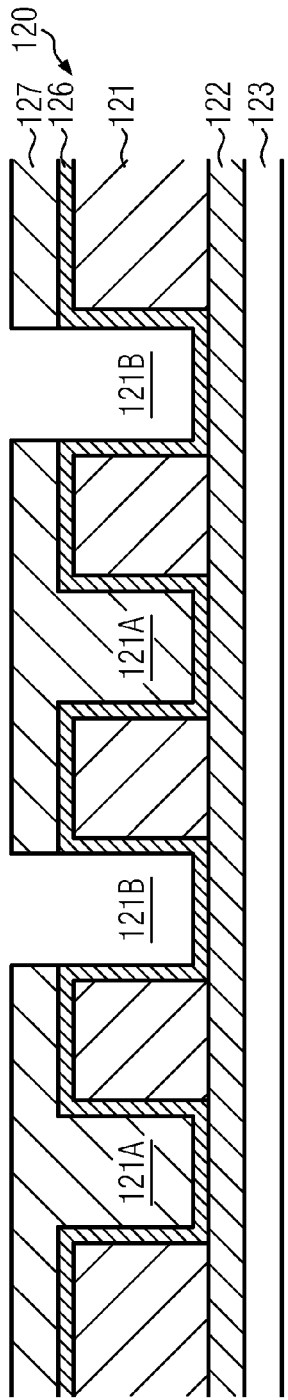

FIG. 1d schematically illustrates the device 120 in a further advanced manufacturing stage. As illustrated, a deposition mask 127 may be provided, for instance in the form of any appropriate material, which may be efficiently removed in a later manufacturing stage selectively with respect to the material 126 and any semiconductor material to be provided in the opening 121B. For example, the mask 127 may be comprised of silicon nitride and the like, or of any other materials which are appropriately treated so as to withstand the temperature conditions during a subsequent deposition process for providing a semiconductor material in the openings 121B. The deposition mask 127 may be provided on the basis of appropriate lithography techniques, wherein, as discussed above, the non-critical lateral dimensions of the openings 121A, 121B may provide non-critical conditions with respect to alignment and patterning of the mask 127.

Figure 1E:
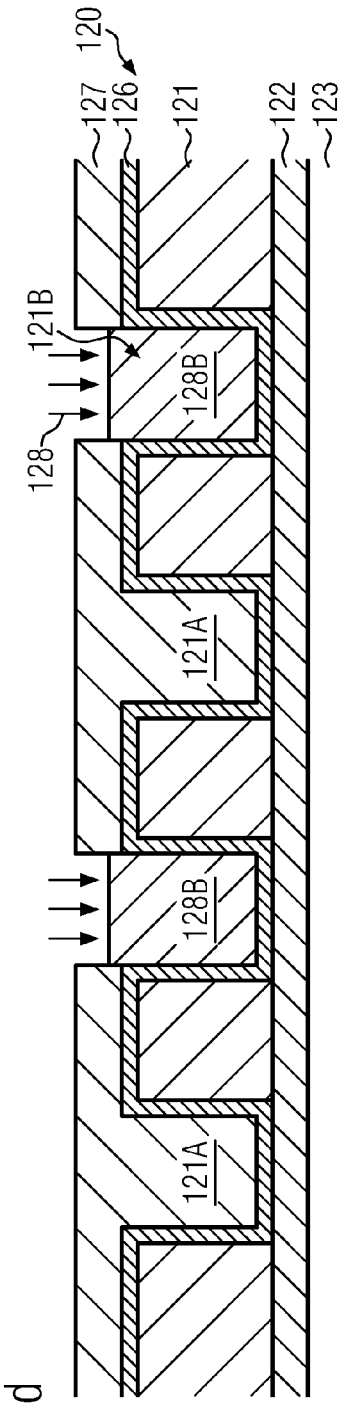

FIG. 1e schematically illustrates the device 120 during a process 128 for providing an appropriate semiconductor material 128B in the openings 121B. For example, the semiconductor material 128B may represent a doped semiconductor material that may be appropriate for forming a Peltier element. For example, silicon/germanium represents an appropriate base material for forming a Peltier element. It should be appreciated, however, that any other appropriate semiconductor compound may be used with an appropriate dopant concentration in order to obtain an efficient thermoelectric effect upon completing a Peltier element. The process 128 may comprise any appropriate deposition process which may provide a sufficiently high deposition rate in order to fill the deep trenches 121B. For example, liquid phase epitaxy (LPE) may be applied so as to preferably deposit the material 128B in the openings 121B. To this end, the deposition parameters may be selected so as to reduce any deposition of material on the deposition mask 127. In other cases, the process 128 may comprise an additional removal process for removing excess material formed during the deposition of the semiconductor material 128B on the deposition mask 127. For example, chemical mechanical polishing (CMP), etching and the like may be applied. It should be appreciated that, during the deposition of the material 128B, any concentration and type of dopant species may be incorporated so as to provide the semiconductor material in the form of a doped semiconductor material, for instance a P-doped silicon/germanium semiconductor material and the like.

Figure 1F:
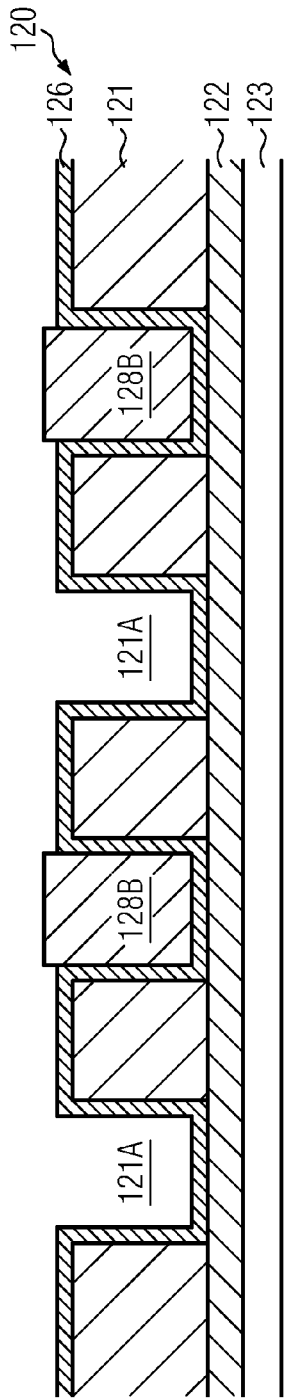

FIG. 1f schematically illustrates the device 120 after the removal of the deposition mask 127 (FIG. 1e). To this end, any appropriate removal process may be applied, wherein the dielectric material 126 and the semiconductor material 128B may act as stop materials. For example, a plurality of etch recipes are available for removing silicon nitride selectively with respect to silicon oxide, silicon, silicon/germanium and the like.

Figure 1G:
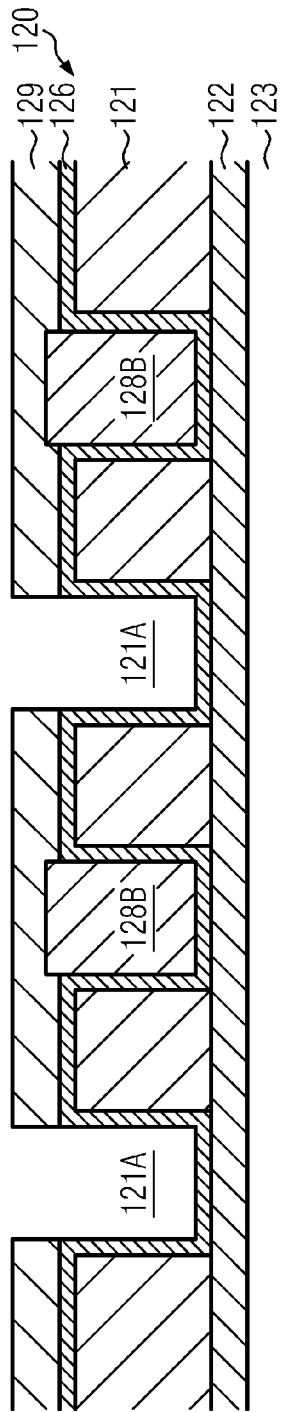

FIG. 1g schematically illustrates the semiconductor device 120 with a further deposition mask 129, which exposes the openings 121A while covering the previously formed semiconductor material 128B. The mask 129 may be formed on the basis of similar process strategies as previously discussed with reference to the deposition mask 127 of FIG. 1d.

Figure 1H:
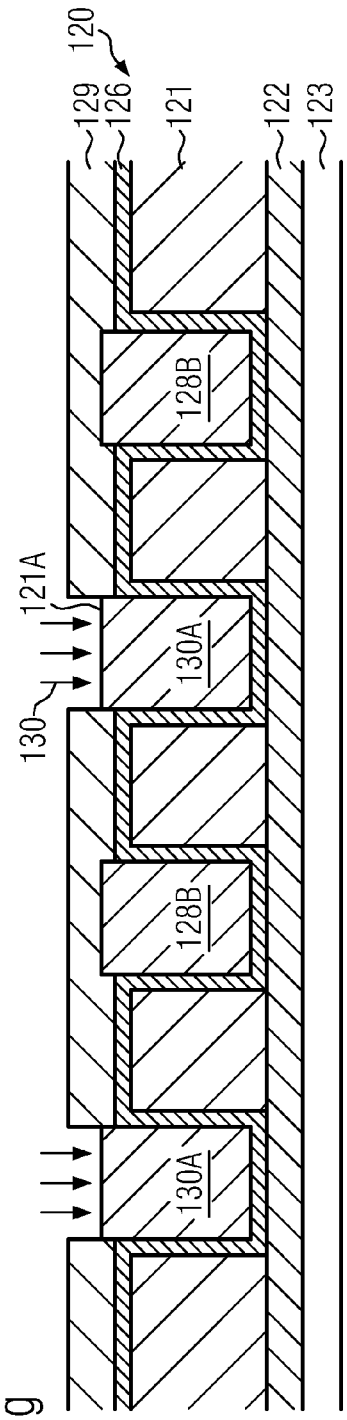

FIG. 1h schematically illustrates the device 120 during a further process 130 for depositing a semiconductor material 130A such as an N-doped semiconductor material having the same base configuration as the material 128B. Consequently, the semiconductor materials 130A and 128B may have different energy levels with respect to their conduction bands, as is required for obtaining the desired thermoelectric effect upon appropriately connecting the semiconductor regions 128B and 130A so as to form a Peltier element, as will be described later on in more detail. With respect to the process 130, the same criteria may apply as previously provided with respect to the deposition process 128 described in FIG. 1e.

In the embodiments described above, a difference in conduction band energy may be accomplished by providing the same basic semiconducting material and providing an N-type doping and a P-type doping, wherein the dopant species may be incorporated during the corresponding deposition processes. That is, in this case, an in situ doping may be applied by adding an appropriate doping species into the deposition atmosphere of the corresponding deposition processes. In other cases, in addition to or alternatively to providing two different types of dopings, different base materials may be used, for instance, with the same type of doping species, as long as an appropriate difference in conduction band energy may be achieved. In still other illustrative embodiments (not shown), the materials 128B, 130A may be provided as non-doped materials, or only one of these materials may be provided in the form an in situ doped material, while the dopant species for the other material or the dopant species for both semiconductor materials may be introduced on the basis of an ion implantation process in combination with an appropriate masking regime. To this end, any well-established ion implantation recipes may be applied. In other illustrative embodiments (not shown), a portion of the substrate itself may be used as one type of semiconductor material, wherein an appropriate doping concentration may be incorporated by ion implantation, for instance on the basis of a non-masked implantation process prior to forming any openings in the substrate 121. Thereafter, appropriate openings may be formed, such as the openings 121A or the openings 121B (FIG. 1b) and the insulating material 126 may be formed in the corresponding openings 121A or 121B so as to provide the required electrical isolation of the remaining material of the substrate 121 from a further semiconductor material, such as the materials 130A or 128B. In this case, one of the deposition processes 128 or 130 may be omitted and may thus be "replaced" by an implantation process providing the required dopant concentration in the substrate 121. In other cases, if a non-masked implantation of a dopant species into the substrate 121 may be considered inappropriate, the substrate 121 may be doped on the basis of a masked ion implantation process so as to locally provide the desired dopant concentration.

In still other illustrative embodiments, the substrate material 121 may be provided in the form an appropriately pre-doped material, such as a silicon/germanium material, thereby avoiding an additional implantation process for achieving a desired dopant concentration in the substrate 121, which, in combination with an additional semiconductor material formed in one of the openings 121A, 121B, may result in the desired difference in conduction band energy level.

Figure 1I:
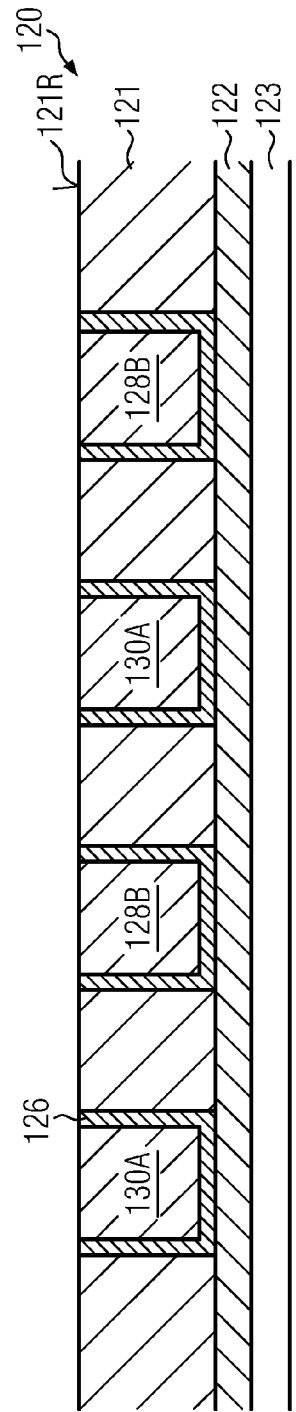

FIG. 1i schematically illustrates the semiconductor device 120 in a further advanced manufacturing stage, in which the semiconductor regions 128B, 130A are provided as electrically isolated regions within the substrate 121, which may be accomplished, for instance starting from the configuration as shown in FIG. 1h, by performing a material removal process, such as a CMP process and the like. Consequently, a substantially planar surface at the rear side 121R of the substrate 121 may be obtained. As discussed before, in other illustrative embodiments, one of the semiconductor regions 128B, 130A may be provided in the form of a portion of the substrate 121, when having the desired thermoelectric behavior in combination with the other material 128B or 130A.

As indicated above, the further processing may be continued by forming circuit elements, such as transistors, if the semiconductor materials 130A, 128B may have a required high temperature stability, while, in other cases, any such circuit elements may have already been formed in and above the device level 123 at least to a stage, wherein any additional high temperature processes may no longer be required.

Figure 1J:
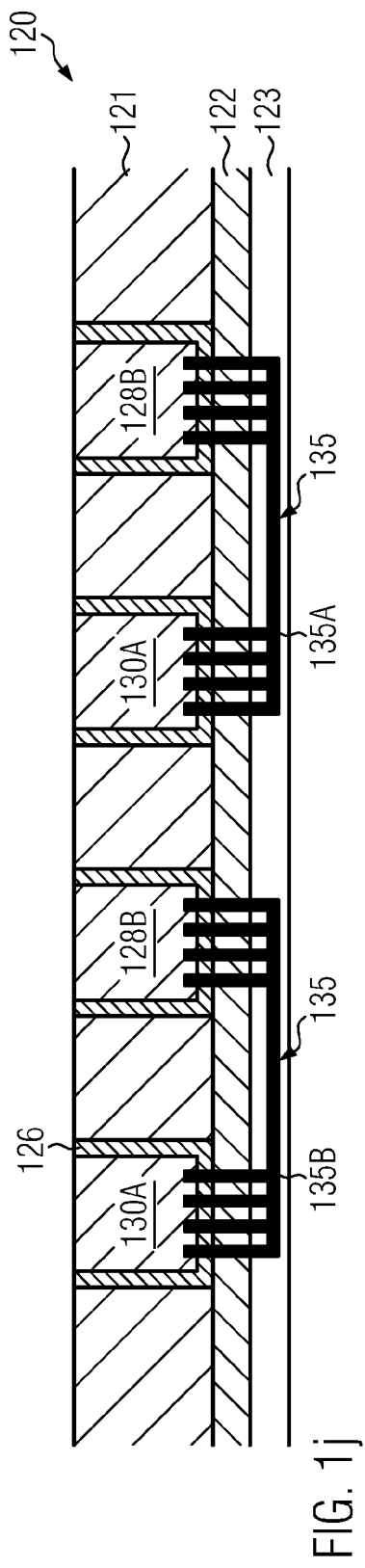
FIG. 1*j* schematically illustrates a cross-sectional view of a semiconductor device in a further advanced manufacturing stage, in which a wiring system is provided so as to appropriately connect the semiconductor regions of the Peltier element, according illustrative embodiments.

FIG. 1j schematically illustrates the device 120 in a further advanced manufacturing stage. As illustrated, a wiring system 135 may be provided so as to appropriately connect a respective one of the semiconductor regions 128B with a respective one of the semiconductor regions 130A, as indicated by wiring components 135A and 135B, respectively. Consequently, the wiring system 135 in combination with the semiconductor regions 128B, 130A may represent the first portion of a "distributed" Peltier element, which may be completed on the basis of an additional semiconductor device of a stacked device configuration, as will be described later on in more detail.

The wiring system 135 may be provided on the basis of metal materials, as are typically used in the device level 123, or on the basis of any other appropriate conductive material in accordance with process and device requirements. The wiring system 135 may thus represent a heat sink or heat source area of a Peltier element still to be formed in order to provide superior thermal coupling to critical device areas in the device level 123, for instance to fast-switching transistor elements and the like, as are typically used in sophisticated circuits, such as CPUs and the like. As will be described later on in more detail, the wiring system 135 may be formed together with a wiring network for the device 120, such as a contact level and metallization system and the like to be formed in and above the device level 123.

Figure 1K:
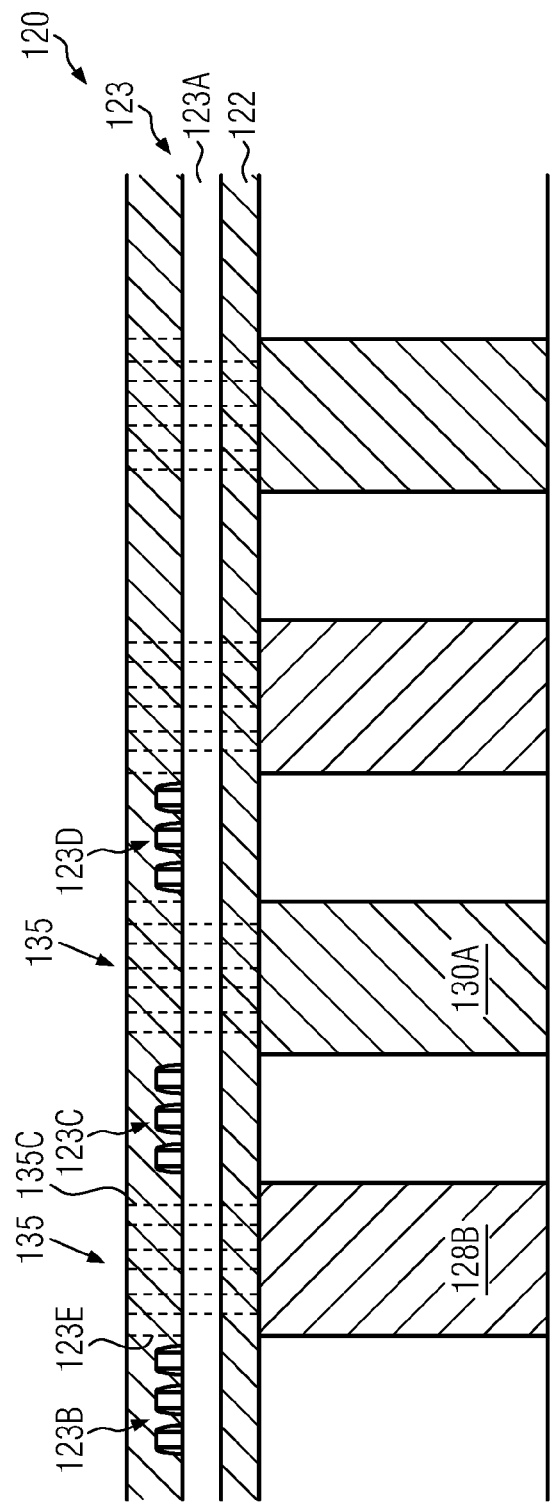

FIG. 1k schematically illustrates a cross-sectional view of the device 120 in a manufacturing stage in which circuit elements 123B, 123C, 123D may be formed in and above the semiconductor layer 123A of the device level 123. The circuit elements 123B, 123C, 123D may represent any sophisticated circuit elements, such as transistors and the like, wherein at least some of these circuit elements may form a complex circuit. For example, the circuit elements 123B, 123C, may form complex logic circuitry, for instance in the form of a CPU and the like. In the embodiment shown, the circuit elements 123D may represent an appropriate control circuit in order to provide superior temperature control in the device 120 and in a stacked device configuration, as will be described later on in more detail. It should be appreciated that at least some of the circuit elements 123B, 123C, 123D may be formed on the basis of critical dimensions of 50 nm and significantly less. Furthermore, the circuit elements may be embedded in any appropriate dielectric material, such as silicon dioxide, silicon nitride, in which appropriate contact elements 123E may connect to the circuit elements 123B, 123C, 123C. Moreover, a portion of the wiring system 135 may be provided in form of contact elements 135C, which may extend through the device level 123 and may connect to respective ones of the semiconductor regions 128B, 130A.

The semiconductor device 120 as shown in FIG. 1k may be formed on the basis of any well-established process strategies for forming the circuit elements 123B, 123C, 123D in combination with any contact process techniques, followed by appropriate patterning strategies for forming openings for the contact elements 123E and 135C, which may be subsequently filled with any appropriate conductive material, such as tungsten, aluminum and the like. It should be appreciated that, if required, the contact elements 135C may be formed on the basis of a process strategy in which a portion of these elements may be formed in an earlier manufacturing stage, for instance by forming a window in the semiconductor layer 123A and in the buried insulating material 122, and the like.

FIG. 1l schematically illustrates the device 120 according to further illustrative embodiments in which the wiring system 135 may be established within the buried insulating material 122 and within the semiconductor layer 123A, substantially without extending into the contact level 123B. To this end, appropriate openings may be formed in the semiconductor material 122 and may be filled with any appropriate conductive material, while a connecting line 135D of the wiring system 135, which may connect appropriate ones of the semiconductor regions 128B and 130A, may be formed in the semiconductor layer 123A, for instance in the form of a highly doped material, possibly in combination with any metal silicide material. To this end, the component 135D may be formed in accordance with any processes which may also be used for forming any circuit elements and contact areas of transistors, for instance on the basis of high dopant concentrations and silicidation processes. As previously discussed, in this manner, the actual thermal coupling provided by the wiring system 135 may be located directly within the semiconductor material of the device level 123, thereby providing a very efficient thermal coupling to any power consuming circuit portions.

FIG. 1m schematically illustrates the device 120 according to further illustrative embodiments in which the connecting component 135D of the wiring system 135 may be provided in the contact level 123B of the device level 123. That is, as discussed above, typically, a dielectric material is provided in the contact level 123B so as to passivate any circuit elements, such as gate electrodes of transistors and the like, as is also previously discussed with reference to FIG. 1k. Upon forming appropriate contact elements in the contact level 123B, the connecting component 135D may be formed without requiring any additional process steps. In this case, a highly conductive path may also be established between respective ones of the semiconductor regions 128B, 130A, while also providing an efficient thermal coupling to the circuit elements.

FIG. 1n schematically illustrates the device 120 according to further illustrative embodiments in which the device level 123 may comprise a metallization system 123M, which connects to the contact level 123B, wherein the connecting components 135D of the wiring system 135 may be provided in one or more metallization layers of the metallization system 123M. In the embodiment shown, the very first metallization layer of the system 123M may be illustrated only and the components 135D may be formed in the very first metallization layer. In this manner, a highly conductive path may be provided with an efficient thermal coupling to the semiconductor based circuit elements formed in and above the semiconductor layer 123A. Also in this case, the connecting components 135D may be provided without any additional process steps, compared to a conventional metallization system of a semiconductor device.

Moreover, the semiconductor device 120 may comprise a contact or bump structure 140, which may comprise appropriate contact areas 141 connecting to the semiconductor regions 128B, 130A, which may be appropriate for receiving appropriate elements 142, such as bumps, metal pillars and the like. To this end, any appropriate materials may be used, such as aluminum, tungsten, copper, titanium and the like, in accordance with any well-established process techniques for forming appropriate bump structures. The elements 142 may be provided in the form of a solder material, such as lead-free solder materials, copper, gold and the like. For this purpose, a plurality of well-established process techniques are available.

FIG. 1o schematically illustrates a cross-sectional view of a further semiconductor device 150, which in combination with the device 120, as described above with reference to FIGS. 1a-1n, is to be combined so as to provide a stacked device configuration, as will be described later on in more detail. The device 150 may comprise a substrate 151 having a rear side 151R and a front 151F, above which may be provided circuit elements 153C, 153D, such as transistors and the like. The circuit elements 153C, 153D may represent components of a device level 153 of the device 150 which may additionally comprise a contact level, a metallization system and the like, as is also previously described with reference to the device 120. The circuit elements 153C, 153D may form any appropriate functional circuit, such as a memory circuit in the form of a dynamic RAM circuit, in combination with appropriate storage capacitors and the like. In other cases, additionally, some of the circuit elements, such as the elements 153D, may form appropriate control circuitry for operating or controlling a distributed Peltier element to be formed on the basis of the device 120 (see FIGS. 1a-1n) and the device 150. Furthermore, the device 150 may comprise a wiring system 155, which may comprise a plurality of metal based components 155D formed in the device level 153, i.e., in a contact level and/or a metallization system of the device 150, thereby providing an efficient heat sink or heat source of the distributed Peltier element still to be formed. The wiring system 155 may further comprise a contact structure 155C, which may represent a complementary structure with respect to the contact structure 140 as shown in FIG. 1n in order to enable the connection of the devices 150 and 120. Moreover, the contact structure 155C may be connected to the components 155D by appropriately formed through-hole vias 155V, which may extend through the substrate 151 and which may be filled with any appropriate conductive material, such as a metal-based material, semiconductor material, carbon material and the like.

The device 150 as shown in FIG. 1o may be formed on the basis of any appropriate process strategies for forming the elements 153C, 153D. Similarly, the components 155D of the wiring system 155 may be formed on the basis of manufacturing techniques which may also be applied for providing an appropriate contact level and metallization system for the circuit elements 153C, 153D, for instance in a similar manner as previously described with reference to the device 120. Similarly, the contact structure 155C of the wiring system 155 may be formed at any appropriate manufacturing stage, that is, the vias 155V may be formed prior to providing any circuit elements, if these components are compatible with high temperature processes, while, in other cases, the vias 155V may be formed in a later manufacturing stage, for instance after completing at least a portion of the circuit elements 153C, 153D. It should be appreciated that the contact structure 155C and the through-hole vias 155V may be formed in accordance with any appropriate process strategy in which additional through-hole vias and contact areas may also be provided for operatively connecting the circuit elements 153C, 153D to the semiconductor device 120 (FIGS. 1a-1n), as required for establishing a combined integrated circuit with superior functionality, as is also previously discussed.

Figure 1P:
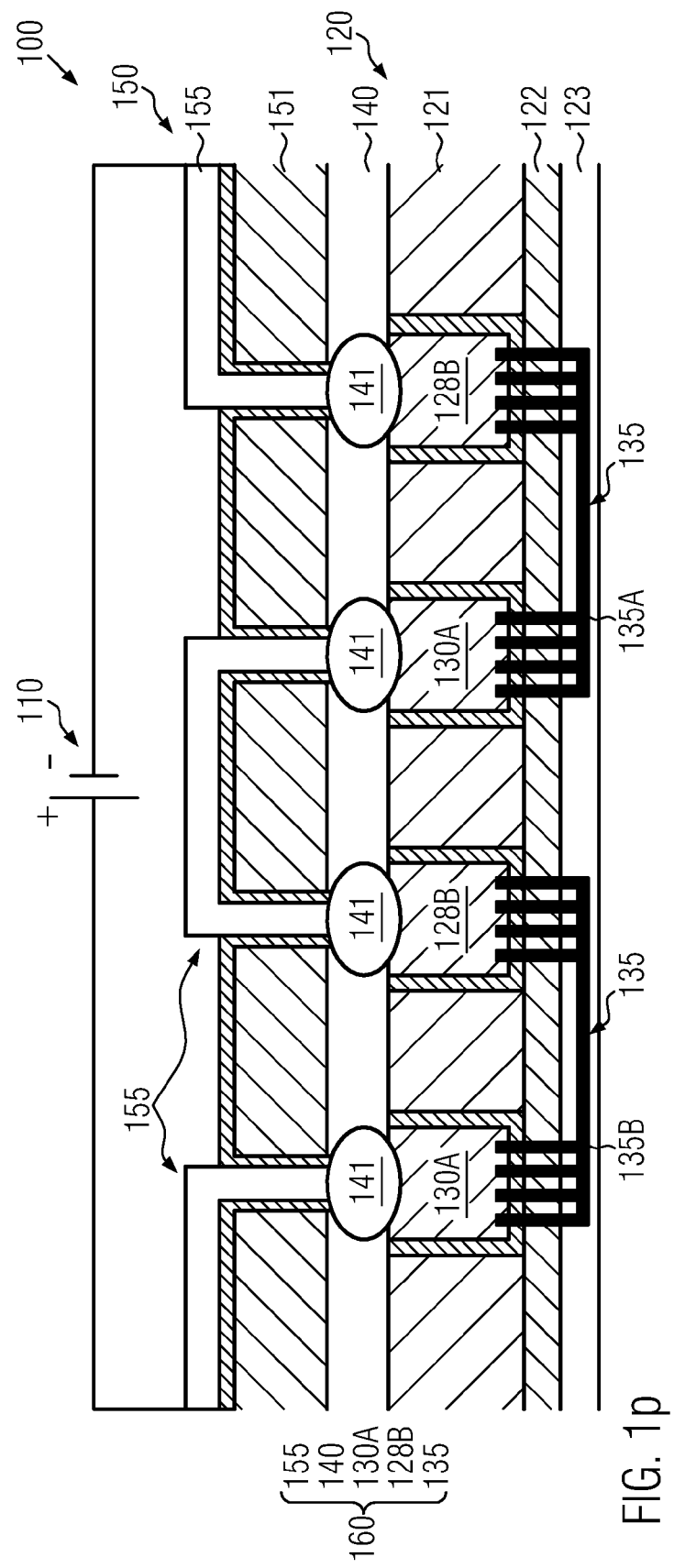
FIG. 1*p* schematically illustrates a cross-sectional view of the total semiconductor device forming a stacked device configuration including a "distributed" Peltier element so as to provide an efficient heat transfer system through the stacked device configuration, according to illustrative embodiments.

FIG. 1p schematically illustrates a combined semiconductor device 100 comprising the devices 150 and 120 in a stacked device configuration. That is, the device 120 may be connected to the device 150 via the bump structure 140, thereby appropriately connecting the wiring system 155 of the device 150 with the semiconductor regions 128B, 130A of the device 120. Consequently, the wiring system 155 in the device 150 in combination with the bump structure 140, the semiconductor regions 130A, 128B and the wiring system 135 may form a Peltier element 160, which may be considered as a distributed Peltier element, since the various components may be provided in and above the substrates 121 and 151, respectively.

The devices 120 and 150 may be connected to each other on the basis of any well-established contact technologies, for instance by reflowing the bumps 141 after mechanically contacting the substrates 151 and 121. In this manner, any other connections may also be established between the devices 150, 120, as required for forming a functionally combined integrated circuit of the stacked device 100.

As illustrated, the wiring system 155 is further configured so as to connect to a power source 110, which may enable establishing an appropriate current flow through the Peltier element 160, wherein, in the embodiment shown, the wiring system 135 may represent the cooled part of the Peltier element 160 and may thus act as a heat sink, while the wiring system 155 may act as the heated area and may thus represent the heat source of the Peltier element 160. Consequently, when the device 120 represents a high power circuit, such as a CPU, the waste heat generated in the device level 123 may be efficiently coupled into the wiring system 135 and may be transferred into the wiring system 155, acting as a heat source, thereby efficiently transferring waste heat from the device 120 into the device 150, which in turn may provide superior overall heat management within the stacked device 100. It should be appreciated that, typically, the device 100 may be provided in a package, which may connect to an external cooling system, such as a cooler fan, via the device 150, thereby providing an efficient overall heat dissipation from the high power device 120 to an external cooling system.

Figure 1Q:
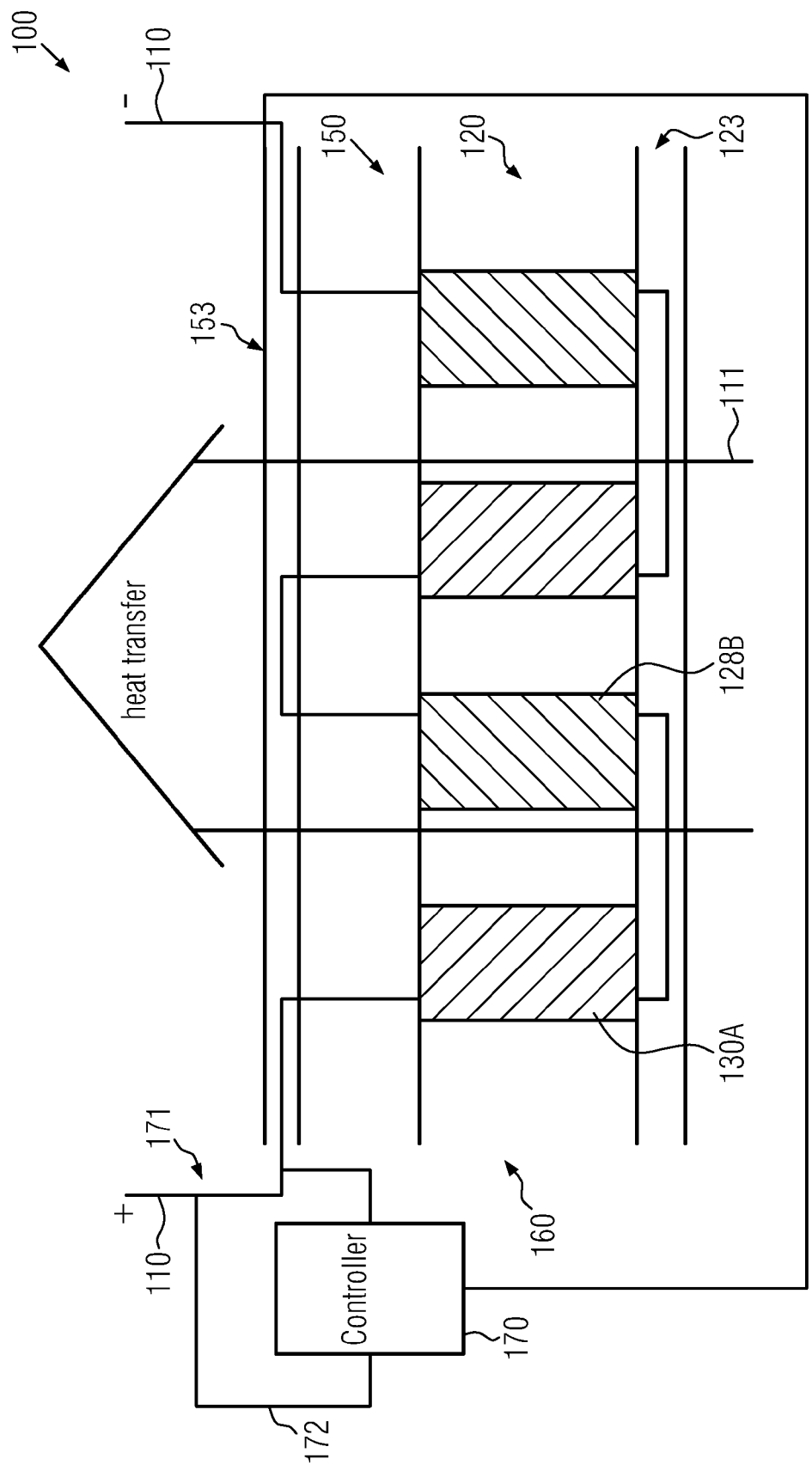
FIG. 1*q* schematically illustrates the stacked semiconductor device according to illustrative embodiments in which operation of the distributed Peltier element may be controlled on the basis of a control unit that may be provided internally or externally in order to achieve superior overall heat management in the stacked device configuration.

FIG. 1q schematically illustrates the stacked semiconductor device 100 according to further illustrative embodiments. As illustrated, a control unit 170 may be provided, for instance as a device internal control system, that may be formed in one or both of the devices 120 and 150, while, in other cases, a portion of the control unit 170 may be provided as a device external component, for instance outside of a package of the stacked semiconductor device 100. Moreover, a controlled switching system 171 may be provided so as to controllably activate or deactivate the power supply 110 connected to the Peltier element 160. For example, the system 171 may comprise an electronic switch, which may be controlled by the unit 170 in order to activate and deactivate the power supply 110 and thus the cooling effect of the Peltier element 160. In other illustrative embodiments, the system 171 may comprise a duty cycle controlled circuit configuration, in which the current flow through the Peltier element 160 may be controlled in order to adjust the heat transfer capability of the Peltier element 160. To this end, the control unit 170 may receive an appropriate temperature signal 172, which may indicate the temperature in one or both of the devices 120, 150. For example, if the temperature signal 172 indicates a certain temperature state of the device 100, the control unit 170 may deactivate current flow through the Peltier element 160 by disconnecting the Peltier element 160 from the power supply 110. In other cases, the current flow may be regulated on the basis of the temperature signal 172, for instance by adjusting the duty cycle of a switched regulator unit in the system 171. In other illustrative embodiments, the temperature signal 172 may be obtained from the Peltier element 160, for instance in a phase, when the Peltier element 160 is decoupled from the power supply 110, so that a corresponding temperature induced voltage may be detected by the control unit 170 as the temperature signal 172.

It should be appreciated that basically the system 171 may also be configured to invert the current through the Peltier element 160, thereby also inverting a direction of heat transfer 111, thereby conveying heat from the device 150 into the device 120, if considered appropriate. Moreover, in some illustrative embodiments, the Peltier element 160 may be used as a thermoelectric generator, not only for providing the temperature signal 172 but also for obtaining a certain degree of usable electrical energy which may be used for operating the device 100, as long as a non-critical temperature state is maintained within the semiconductor device 100, without requiring active operation of the Peltier element 160 so as to induce the active heat transfer 111.

As a result, the present disclosure provides semiconductor devices of stacked configuration in which a distributed Peltier element may provide superior heat transfer, for instance, from a high power circuit, such as a CPU, to a low power circuit, such as a dynamic RAM circuit, and thus finally to an external heat sink, thereby enabling superior performance for a given desired high volume packing density.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of controlling temperature in a semiconductor device comprising a stacked device configuration, the method comprising:
    providing a Peltier element that is distributed between circuit elements positioned in or above respective first and second substrates of said stacked device configuration, said Peltier element comprising:
        a metal-based heat sink comprising a first wiring system formed above said first substrate of said stacked device configuration, said first wiring system connecting to a plurality of semiconductor regions formed in said first substrate via a front side of said first substrate; and
        a metal-based heat source comprising a second wiring system formed above said second substrate of said stacked device configuration, said second wiring system connecting to said plurality of semiconductor regions formed in said first substrate through openings extending through said second substrate; and
    establishing a current flow through said Peltier element when said semiconductor device is in a specified operating phase.

2. The method of claim 1, wherein said first substrate comprises a central processing unit and said second substrate comprises a memory circuit.

3. The method of claim 1, further comprising obtaining a temperature signal from said Peltier element and determining a thermal status of said semiconductor device by using said temperature signal.

4. The method of claim 1, further comprising providing a control unit and using said control unit to control said current flow through said Peltier element.

5. The method of claim 4, wherein controlling said current flow through said Peltier element comprises operating a switching system of said control unit so as to invert said current flow through said Peltier element, said inverted current flow inverting a direction of heat transfer in said semiconductor device.

6. The method of claim 4, wherein providing said control unit comprises providing said control unit as a device external control unit outside of said stacked device configuration of said semiconductor device.

7. The method of claim 4, wherein providing said control unit comprises providing said control unit as a device internal control unit that is formed on at least one of said first and second substrates.

8. The method of claim 4, further comprising operating said Peltier element as a thermoelectric generator so as to provide electrical energy to said semiconductor device.

9. A method of controlling temperature in a semiconductor device comprising a plurality of stacked substrates, the method comprising:
    providing a Peltier element comprising a metal-based heat sink formed above a first substrate of said plurality of stacked substrates and a metal-based heat source formed above a second substrate of said plurality of stacked substrates, said first substrate comprising a central processing unit and said second substrate comprising a memory circuit, wherein said metal-based heat sink formed above said first substrate comprises a first wiring system connecting to a plurality of semiconductor regions formed in said first substrate via a front side of said first substrate, and wherein said metal-based heat source formed above said second substrate comprises a second wiring system connecting to said plurality of semiconductor regions through openings extending through said second substrate;

operatively coupling a control unit to said Peltier element; and controlling a current flow through said Peltier element with said control unit.

10. The method of claim 9, wherein controlling said current flow through said Peltier element comprises at least one of establishing said current flow through said Peltier element or discontinuing said current flow through said Peltier element when said semiconductor device is in a specified operating phase.

11. The method of claim 9, wherein controlling said current flow through said Peltier element comprises obtaining a temperature signal from said Peltier element and using said temperature signal to determine a thermal status of said semiconductor device.

12. The method of claim 9, wherein controlling said current flow through said Peltier element comprises inverting said current flow through said Peltier element so as to invert a direction of heat transfer in said semiconductor device.

13. The method of claim 9, wherein operatively coupling said control unit to said Peltier element comprises providing said control unit as a device external control unit outside of said semiconductor device.

14. The method of claim 9, wherein operatively coupling said control unit to said Peltier element comprises providing said control unit as a device internal control unit that is formed on at least one of said first and second ones of said stacked substrates.

15. The method of claim 8, further comprising operating said Peltier element as a thermoelectric generator so as to provide electrical energy to said semiconductor device.

16. The method of claim 9, wherein controlling said current flow through said Peltier element comprises transferring heat from a first circuit comprising said first substrate of said plurality of stacked substrates to a second circuit comprising said second substrate of said plurality of stacked substrates, said first circuit having a higher power consumption than said second circuit.

17. The method of claim 1, further comprising transferring heat from a first circuit comprising said first substrate of said stacked device configuration to a second circuit comprising said second substrate of said stacked device configuration, said first circuit having a higher power consumption than said second circuit.

18. A method of controlling temperature in a semiconductor device comprising a stacked device configuration, the method comprising:

providing a Peltier element that is distributed between circuit elements positioned in or above respective first and second substrates of said stacked device configuration, said Peltier element comprising:
a metal-based heat sink comprising a first wiring system formed above said first substrate of said stacked device configuration, wherein said first wiring system comprises a plurality of first connections that each connect one of a plurality of first semiconductor regions formed in said first substrate with one of a plurality of second semiconductor regions formed in said first substrate; and
a metal-based heat source comprising a second wiring system formed above said second substrate of said stacked device configuration, wherein said second wiring system comprises a plurality of second connections that each connect one of said plurality of first semiconductor regions with one of said plurality of second semiconductor regions; and establishing a current flow through said Peltier element when said semiconductor device is in a specified operating phase.

19. The method of claim 18, wherein said first and second semiconductor regions formed in said first substrate have different conduction band energy levels.

20. The method of claim 18, wherein said circuit elements positioned in or above said first substrate comprise a central processing unit, and wherein said circuit elements positioned in or above said second substrate comprise a memory circuit.

* * * * *